United States Patent
Zapf et al.

(10) Patent No.: US 11,253,951 B2
(45) Date of Patent: Feb. 22, 2022

(54) METHOD FOR THE PRETREATMENT OF RARE-EARTH MAGNETS PRIOR TO SOLDERING USING NANOCRYSTALLINE SOLDERING FOILS AND MAGNETIC COMPONENT

(71) Applicant: Vacuumschmelze GmbH & Co. KG, Hanau (DE)

(72) Inventors: Lothar Zapf, Alzenau (DE); Natalia Ankuda, Buedingen (DE); Manfred Reuther, Buedingen (DE)

(73) Assignee: VACUUMSCHMELZE GMBH & CO. KG, Hanau (DE)

( * ) Notice: Subject to any disclaimer, the term of this patent is extended or adjusted under 35 U.S.C. 154(b) by 158 days.

(21) Appl. No.: 16/718,865

(22) Filed: Dec. 18, 2019

(65) Prior Publication Data
US 2020/0198047 A1    Jun. 25, 2020

(30) Foreign Application Priority Data
Dec. 19, 2018    (DE) .................... 10 2018 132 924.5

(51) Int. Cl.
| | |
|---|---|
| B23K 20/00 | (2006.01) |
| B23K 20/16 | (2006.01) |
| H05K 3/34 | (2006.01) |
| H01F 1/055 | (2006.01) |
| B23K 1/00 | (2006.01) |

(52) U.S. Cl.
CPC .......... *B23K 20/165* (2013.01); *B23K 1/0006* (2013.01); *H01F 1/055* (2013.01); *H05K 3/341* (2013.01)

(58) Field of Classification Search
CPC .......... B23K 20/12–122; B23K 20/129–1295; B23K 2103/18; B21B 15/0085
USPC ...................................................... 228/234.3
See application file for complete search history.

(56) References Cited

U.S. PATENT DOCUMENTS

| | | | | |
|---|---|---|---|---|
| 3,321,328 A | * | 5/1967 | Koretzky | ............... C23C 18/48 427/131 |
| 3,867,106 A | * | 2/1975 | Venkatasetty | ........... H01F 10/16 428/678 |
| 6,054,331 A | * | 4/2000 | Woo | ...................... C23C 14/165 438/3 |
| 2005/0082343 A1 | | 4/2005 | Wang et al. | |

(Continued)

FOREIGN PATENT DOCUMENTS

| | | | |
|---|---|---|---|
| CN | 109208047 A | 1/2019 | |
| JP | 63260114 A | * 10/1988 | ............... B23H 7/08 |
| JP | 2008147642 A | 6/2008 | |

OTHER PUBLICATIONS

German Office Action dated Sep. 10, 2019 with English Translation corresponding to German Application No. 10 2018 132 924 5.

(Continued)

*Primary Examiner* — Kiley S Stoner
(74) *Attorney, Agent, or Firm* — Dickinson Wright PLLC

(57) ABSTRACT

A magnetic component with a rare-earth magnet is provided. The rare-earth magnet has a bronze coating that partially or entirely covers the surface of the rare-earth magnet. Further, the tin coating partially or entirely covers the bronze coating. A production process for the magnetic component as well as a soldering method for connecting the magnetic component with a substrate is also provided.

11 Claims, 2 Drawing Sheets

(56) References Cited

U.S. PATENT DOCUMENTS

2009/0258247 A1* 10/2009 Kulkarni ............. C23C 28/3455
428/632
2010/0330361 A1 12/2010 Yoshida et al.

OTHER PUBLICATIONS

British Search Report dated May 27, 2020 corresponding to Appln. No. GB1918834.1.

* cited by examiner

METHOD FOR THE PRETREATMENT OF RARE-EARTH MAGNETS PRIOR TO SOLDERING USING NANOCRYSTALLINE SOLDERING FOILS AND MAGNETIC COMPONENT

This U.S. patent application claims the benefit of German Patent Application No. DE102018132924.5, filed 19 Dec. 2018, the entire contents of which are incorporated herein by reference for all purposes.

BACKGROUND

1. Technical Field

The present description relates to the field of magnetic materials, in particular to a method for pretreating rare-earth magnets prior to soldering and a corresponding magnetic component.

2. Related Art

Soldering is a thermal method for firmly bonded joining in which a liquid phase is created by melting a solder or by means of diffusion on the interfaces of the parts to be joined. Although the liquidus temperature of the parts to be joined in not reached during soldering, the parts to be joined are heated to very high temperatures in many soldering processes. For this reason, many soldering processes are not suitable for joining permanently magnetized components as these can be completely or partially demagnetized by the heat associated with the soldering.

In his dissertation "Developing Manufacturing Processes for a Cryogenic Undulator and its Validation by means of Magnetic Measurements of a Prototype" (Technische Universität Berlin, Feb. 11, 2016), Carsten Kuhn describes a soldering method for joining rare-earth magnets using reactive nanofoils (e.g. the so-called NanoFoil® produced by Indium Corporation, Utica, N.Y.) during which only a small quantity of heat is induced into the parts to be joined due to the very quick heating of the nanofoil.

In order to obtain a reliable solder bond, it is important for the surfaces to be joined to be easily wetted so that they can be firmly bonded to each other. The rare-earth alloys used for permanent magnets are generally difficult to wet, for which reason the surfaces to be joined need to be coated before soldering. Tin or gold, for example, can be used as a coating material for this purpose.

By employing the soldering method of the aforementioned dissertation, permanently magnetized components made of, e.g. praseodymium, iron and boron ($Pr_2Fe_{14}B$) or of neodymium, iron and boron ($Nd_2Fe_{14}B$) can be soldered together or onto soft magnetic substrates (e.g. made of cobalt and iron). In the case of galvanically tinned samarium-cobalt magnets (Sm2Co17), however, tests have shown that the tin coating adheres very poorly to the samarium-cobalt magnet after soldering using nanofoils although the adhesion of the tin coating before soldering was good. In shear tests, the adhesion of the soldered bonds was revealed to be nearly zero. A double coating that included an electrolessly deposited copper layer followed by a galvanically deposited tin layer was also incapable of solving the problem.

The inventors have set themselves the objective of improving the quality of the solder bond between a rare-earth magnet, in particular one made of $Sm_2Co_{17}$, and a further component.

SUMMARY

Improved quality of a solder bond between a rare earth magnet and a further component can be achieved by a magnetic component in accordance with an aspect of the invention, a method for manufacturing such a component in accordance with an aspect of the invention, as well as by a soldering method in accordance with an aspect of the invention.

One embodiment relates to a magnetic component with a rare-earth magnet. The latter has a bronze coating that partially or entirely covers the surface of the rare-earth magnet. Further, the tin coating partially or entirely covers the bronze coating.

A further embodiment relates to a method for manufacturing a magnetic component. The method includes producing a bronze coating on a rare-earth magnet by electrolessly depositing copper and tin from an electrolyte solution so that the bronze coating entirely or partially covers the rare-earth magnet. The method further includes producing a tin coating on the bronze coating by galvanically depositing tin from a tin bath. In one embodiment the rare-earth magnet is made of a samarium-cobalt alloy. The bronze coating contains a copper-tin alloy in which the copper makes up a proportional mass in the range of 70-95% (mass percent).

Further, a soldering method is described. In accordance with the embodiments described here, the soldering method comprises providing a coated rare-earth magnet that has a wing surface provided with a bronze coating which, in turn, is provided with a tin coating. The coated rare-earth magnet is arranged on a substrate, wherein a tinned reactive foil is arranged between the wing surface of the rare-earth magnet and a corresponding wing surface of the substrate. To produce the solder bond, an exothermic reaction is triggered in the foil. The resulting warmth initiates a diffusion process that firmly bonds the rare-earth magnet to the substrate. In many applications the bronze coating can improve the adhesion of the solder bond.

BRIEF DESCRIPTION OF THE DRAWINGS

In the following, embodiments will be described in greater detail based on illustrations. The drawings are not necessarily true to scale and the embodiments are not limited to the illustrated aspects. Instead importance is given to illustrating the underlying principles of the embodiments. The figures show.

DETAILED DESCRIPTION OF EXAMPLE EMBODIMENTS

Figure 1:
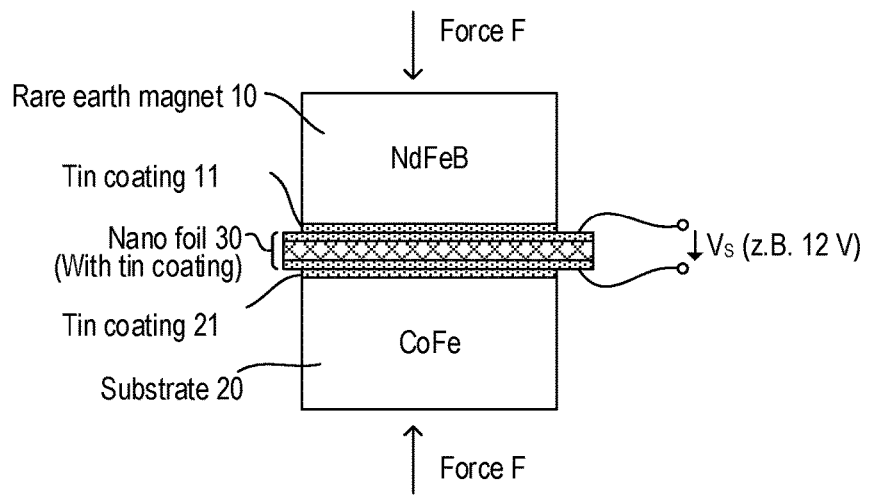
FIG. 1 schematically illustrates a soldering process using nanofoil.

FIG. 1 schematically illustrates a soldering process for joining a rare-earth magnet 10 to a soft-magnetic substrate 20. In the same manner, two rare-earth magnets could also be soldered together. The surfaces of the rare-earth magnet 10 and of the substrate that are to be joined are tinned (tin coatings 11 and 21). A tinned nanofoil 30 is arranged between the components 10 and 20. The nanofoil is a multiple-layer system comprising, for example, numerous alternatingly arranged layers of aluminum and nickel. Multiple-layer systems consisting of other combinations of materials are also possible such as, e.g. aluminum and titan or nickel and silicon. A nanofoil may comprise many thousands of alternating layers consisting of, e.g. aluminum and nickel in which the individual layers have a thickness in the range of 25 nm to 90 nm. The entire nanofoil can have a thickness in the range of 10-100 μm.

If the layers are thin enough and the reaction products of the layers exhibit a negative bond enthalpy (e.g. of −59.2 kJ per mole in the case of aluminum/titanium), a self-propagating exothermic reaction can be triggered in such a multiple-layer system with a relatively small input of energy (e.g. by applying an electric voltage Vs, see FIG. 1), which warms the nanofoil and initiates a diffusion process that produces the solder bond. When the solidus temperature is exceeded, the solder becomes at least partially liquid, producing a firm bond between the solder and the surfaces of the wing segments by means of diffusion. During the soldering process, pressure is applied to the joining region (see FIG. 1, force F) by a device (not shown in FIG. 1). The pressure (joining pressure) applied during soldering can be in the range of 0.1 to 0.3 MPa. The amount of warmth generated during soldering depends on the surface of the joining area and on the thickness of the reactive foil. The achievable energy density is approximately 1000-1250 J/g and temperatures in the range of 130-1500 degrees Celsius can arise (locally in the region of the joining).

The resulting warmth is generated directly in the joining region and the amount of warmth that is generated stays small enough to prevent the components 10 and 20 from being significantly heated. This method thus prevents the magnetic characteristics of the components 10, 20 from being thermally affected (in particular preventing a reduction of their remanent magnetization). As previously mentioned, nanofoils suitable for this purpose are available, e.g. from Indium Corporation, Utica, N.Y., under the tradename of NanoFoil®. The corresponding joining method is known as NanoBond®. Fluxing agents such as those required in other soldering processes are not needed.

As previously mentioned, the soldering method described above does not provide satisfying results when used with certain rare-earth magnets because the adhesion of the tin coating 11 to the surface of the rare-earth magnet after soldering is no longer sufficient. Particularly in tests involving samarium-cobalt ($Sm_2Co_{17}$) magnets, it was not possible to produce in this manner solder bonds having sufficient adhesion.

Figure 2:
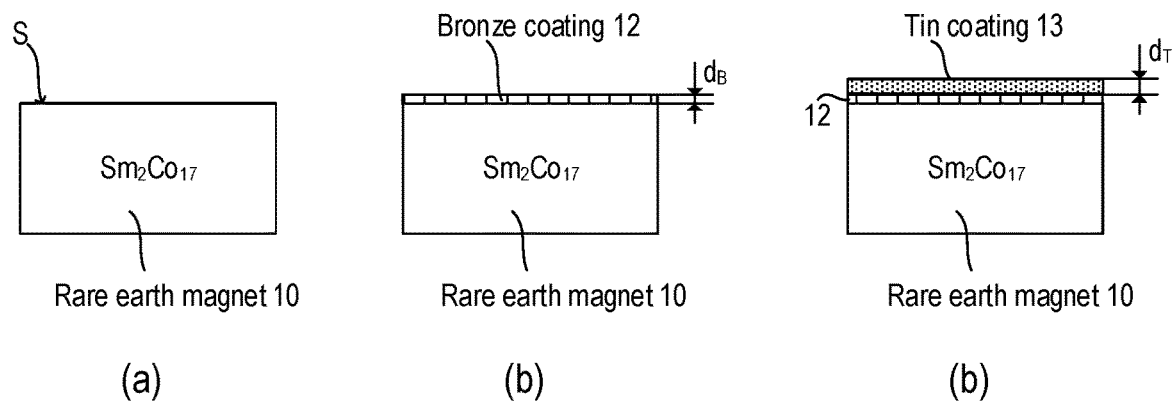
FIG. 2 illustrates an example of a coating process in accordance with the embodiments described here.

The inventors were able to improve this situation by pretreating the rare-earth magnets to be joined. First a rare-earth magnet 10 made, for example, of $Sm_2Co_{17}$ (tradename VACOMAX® 225) is obtained (FIG. 2, diagram a). The rare-earth magnet may have been previously cleaned, pickled and passivated using well-known methods (e.g. ultrasonic cleaning in an alkaline aqueous medium (e.g. having a pH value of app. 9), pickling in a solution of nitric acid, sulfuric acid and water, rinsing in aqueous citric acid, blow-cleaning with compressed air and drying in a convection oven). Following this, a bronze coating 12 is produced—at least on the surfaces to be joined (wing surfaces S) of the rare-earth magnet 10—by means of electroless (i.e. without the application of an external electrical current) deposition (FIG. 2, diagram b). In the embodiments described here, the bronze coating 12 can have a thickness dB of 0.1-3 μm. In some embodiments, the thickness of the coating dB lies in the range of 0.5-2 μm. The electroless deposition comes to a standstill after a bronze coating with a thickness of about 2-3 μm has been deposited. An unduly thin bronze coating (less than 0.1 μm.) reduces the achievable adhesion strength of the solder bond.

Bronze is a copper-tin alloy that can comprise a proportion of copper amounting to 70-95% (i.e. the proportion of tin consequently amounts to 5-30%). In some embodiments the proportion of copper comprises between 85-95% (i.e. the proportion of tin consequently lies in the range of 5-15%). Bronze with a high copper content of over 95% adheres poorly to the samarium-cobalt substrate in the soldering process. The aforementioned percentages relate to the proportion by mass of the alloy components. In addition to copper and tin, other alloy components may also be present (i.e. less than 1%).

In the embodiments described here, the bronze coating 12 is (electrolessly) deposited from a sulfuric acid electrolyte solution. The electrolyte solution comprises copper (II) ions and tin (II) ions, as well as formaldehyde ($CH_2O$) and a wetting agent. The wetting agent is optional and serves to reduce the surface tension of the solution. The proportion of copper in the deposited coating can be determined by altering the composition of the electrolyte solution.

Following this, a solderable tin coating 13 is produced on the bronze coating 12 by means of galvanic deposition (FIG. 2, diagram c). The thickness $d_T$ of the tin coating can be, for example, in the range of 5-30 μm. In some embodiments the thickness of the coating $d_T$ is between 5 and 20 μm. Coatings with a thickness of less than 5 μm may negatively affect the achievable strength of the solder bond. Although the coatings 12 and 13 are only shown from one side in FIG. 2, the rare-earth magnet can also be coated on all sides. After soldering using the process described above with reference to FIG. 1 the tin adheres well to the underlying bronze coating. In shear tests a strength of more than 10 MPa was measured.

It is understood that the tin coating 13 and the bronze coating 12 thermally interact during the soldering process, resulting in tin diffusing into the bronze coating 12 and copper into the tin coating 13, thus forming an alloy in the transitional region between the coatings 12 and 13. The aforementioned tinning flaws of the rare-earth magnet (without an underlying, adhesion-advancing bronze coating) can thus be avoided.

Rare-earth magnets that have been coated as described above can not only be soldered onto soft-magnetic substrates, but rather two such magnets can also be soldered to each other. Formations made up of similarly connected magnets have until now been manufactured by gluing. Many types of glues, however, release gasses in a vacuum and therefore glued-bonded formations are not suitable for employment in a high vacuum. The coating described here makes it possible to use a soldering process to manufacture bonded formations of rare-earth magnets and thus avoids the problems associated with using glues.

The electrolyte solution used for the electroless deposition of the bronze coating can contain, for example, 100-200 g concentrated sulfuric acid per liter of aqueous solution. The aforementioned copper (II) and tin (II) ions can be provided, for example, by copper hydrate (e.g. 10-60 g per liter of aqueous solution) or tin sulfate (e.g. 10-60 g per liter of aqueous solution). The solution can contain 1-20 ml of formalin per liter. As a wetting agent, 20 g per liter of fatty alcohol polyglycol ether (CAS-Reg.-Nr. 71243-46-4) can be used. As previously mentioned, the wetting agent is optional; it is not required if the substrates 10, 20 are free of contaminants and thus capable of being reliably wetted by the electrolyte solution.

During the deposition process, the substrate (e.g. the rare-earth magnet 10) is dipped into the electrolyte solution for 20-120 seconds, in particular for 90-120 seconds. The deposition can be carried out at room temperature (i.e. in the range of 20-30 degrees Celsius). As mentioned above, the coating ceases to grow once a coating with a thickness of app. 2-3 µm has been deposited.

A sulfuric acid bright tin bath can be used for the galvanic tinning of the bronze coating 12. One such suitable product is SLOTOTIN 30-1 from the firm Dr.-Ing. Max Schlötter GmbH & Co. KG, in Geislingen, Germany. Such tin electrolytes are well known and will therefore not be discussed here further.

Figure 3:
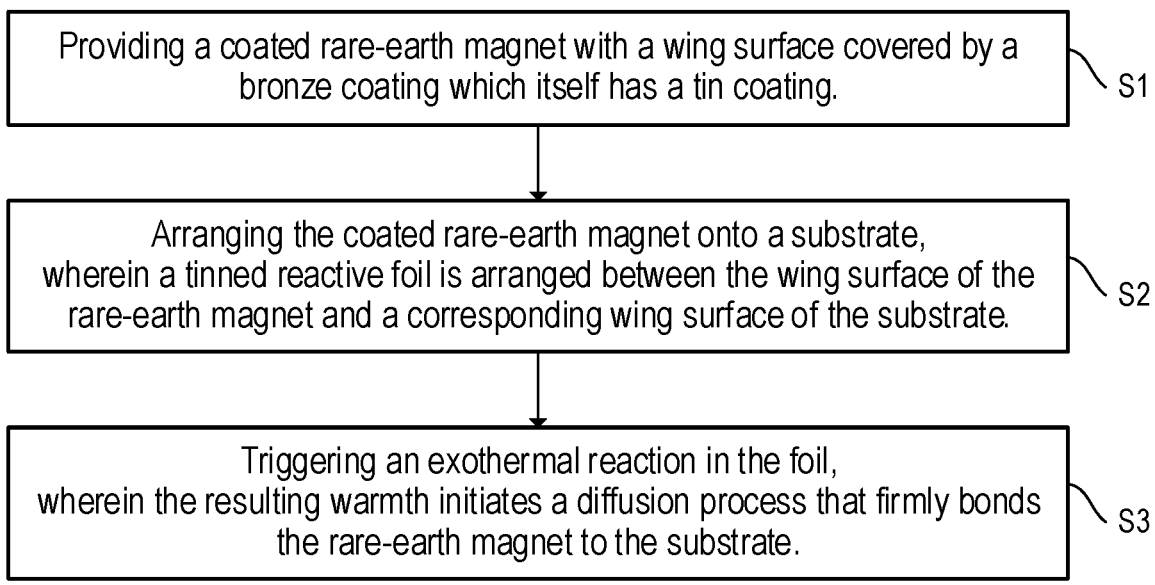
FIG. 3 is a flow chart illustrating the joining process by means of soldering.

FIG. 3 is a flow chart illustrating the joining process for connecting a rare-earth magnet, in particular a permanent magnet made of $Sm_2Co_{17}$, to a substrate by means of soldering. In the first step S1 a coated rare-earth magnet is provided, wherein at least one wing surface of the rare-earth magnet is covered with a bronze coating which, in turn, is covered with a tin coating. In a second step S2, the rare-earth magnet is arranged on the substrate, wherein a tinned, reactive foil, for example, the aforementioned NanoFoil®, is arranged between the wing surface of the rare-earth magnet and a corresponding wing surface of the substrate. The third step S3 is the actual soldering process. In the course of this, an exothermal reaction is triggered in the reactive foil (e.g. by applying an electrical voltage). The thereby generated warmth initiates a diffusion process that firmly bonds the rare-earth magnet with the substrate.

The substrate may be made of a (e.g. tinned) soft-magnetic material or it may be another rare-earth magnet (e.g. made of samarium and cobalt, of neodymium, iron and boron or of similar materials). In accordance with the embodiments described here, the thickness of the bronze coating should be greater than 0.1 µm in order to give the bonded formation sufficient adhesion strength.

The invention claimed is:

1. A method comprising:
    producing a bronze coating on a rare-earth magnet by electroless deposition of copper and tin from an electrolyte solution, wherein the bronze coating entirely or partially covers the rare-earth magnet; and
    producing a tin coating on the bronze coating by galvanic deposition of tin from a tin bath.

2. The method in accordance with claim 1,
    wherein producing the bronze coating comprises dipping the rare-earth magnet at least partially into the electrolyte solution, wherein the electrolyte solution contains copper (II) ions and tin (II) ions.

3. The method in accordance with claim 2,
    wherein the electrolyte solution further contains sulfuric acid and formaldehyde.

4. The method in accordance with claim 2,
    wherein the electrolyte solution further contains a wetting agent.

5. The method in accordance with claim 2,
    wherein the rare-earth magnet remains immersed in the electrolyte solution until a thickness of the bronze coating is equal to or greater than 0.1 µm.

6. The method in accordance with claim 1,
    wherein the galvanic deposition is continued until a thickness of the tin coating is equal to or greater than 5 µm.

7. The method in accordance with claim 5,
    wherein the rare-earth magnet remains immersed in the electrolyte solution until the thickness of the bronze coating is in a range of 0.1-3 µm.

8. The method in accordance with claim 6,
    wherein the galvanic deposition is continued until the thickness of the tin coating is in a range of 5-30 µm.

9. The method in accordance with claim 1, further comprising:
    arranging the coated rare-earth magnet onto a substrate, wherein a tinned, reactive foil is arranged between a wing surface of the rare-earth magnet and a corresponding wing surface of the substrate;
    triggering an exothermal reaction in the foil, wherein a resulting warmth initiates a diffusion process which causes the rare-earth magnet to bond with the substrate.

10. The soldering method in accordance with claim 9,
    wherein, before the exothermal reaction, the reactive foil is a multiple-layer system comprising a multitude of alternatingly arranged layers of different metals which form an alloy during the exothermal reaction.

11. The soldering method in accordance with claim 9,
    wherein the substrate is a magnetic component or a different coated rare-earth magnet.

* * * * *